United States Patent [19]

Shoji

[11] Patent Number: 4,692,637
[45] Date of Patent: Sep. 8, 1987

[54] CMOS LOGIC CIRCUIT WITH SINGLE CLOCK PULSE

[75] Inventor: Masakazu Shoji, Warren, N.J.

[73] Assignee: AT&T Bell Laboratories, Murray Hill, N.J.

[21] Appl. No.: 752,662

[22] Filed: Jul. 8, 1985

[51] Int. Cl.[4] .............. H03K 19/096; H03K 19/003; H03K 19/20; H03K 17/284

[52] U.S. Cl. .................. 307/443; 307/452; 307/481; 307/594; 307/595; 307/601; 307/602; 307/605

[58] Field of Search .............. 307/443, 452, 453, 481, 307/594, 595, 601–603, 605; 377/79, 80, 105, 106

[56] References Cited

U.S. PATENT DOCUMENTS

| | | | |
|---|---|---|---|
| 3,852,625 | 12/1974 | Kubo | 307/481 |
| 3,943,377 | 3/1976 | Suzuki | 307/481 |
| 4,104,860 | 8/1978 | Stickel | 58/23 R |
| 4,250,406 | 2/1981 | Alaspa | 307/205 |
| 4,291,247 | 9/1981 | Cooper, Jr. et al. | 307/443 X |
| 4,404,474 | 9/1983 | Dingwall | 307/443 X |

FOREIGN PATENT DOCUMENTS 2853517  6/1979  Fed. Rep. of Germany ...... 307/443

OTHER PUBLICATIONS

"High Speed Compact Circuits with CMOS", *IEEE J. Solid State Circuits*, vol. SC-17, No. 3, R. H. Krambeck et al, Jun. 1982, pp. 614–619.

Primary Examiner—Larry N. Anagnos
Attorney, Agent, or Firm—Jerry W. Herndon

[57] ABSTRACT

A dynamic, multistage CMOS logic circuit is driven with a single source of clock pulses. The clock pulses operate odd-numbered stages. A static delay circuit provides clock pulses to even-numbered stages. The dynamic and static circuits are designed according to a discipline that guarantees the elimination of race conditions in the dynamic circuit despite the presence of uncontrollable variations in pullup and pulldown delays in the fabrication process.

8 Claims, 3 Drawing Figures

CMOS LOGIC CIRCUIT WITH SINGLE CLOCK PULSE

FIELD OF THE INVENTION

This invention relates to semiconductor integrated circuit (IC) chips, and more particularly to complementary metal-oxide-semiconductor (CMOS) circuitry defined in such chips.

BACKGROUND OF THE INVENTION

A familiar dynamic circuit arrangement in CMOS IC chips comprises an arrangement where the output of one dynamic stage drives directly the next consecutive dynamic stage without inversion of signals therebetween. To drive such directly coupled dynamic circuits at high frequency, first and second clock signals are used. The second clock signals lag the first clock signals by an appropriate phase angle. The first and second clock signals are connected to all the first stages and to all the second stages, respectively, to enable the first and second stages with appropriate time delay. The second stage dynamic gates are enabled by the second clock signals only after the first stage gates have produced stable outputs. To produce the desired precisely delayed second clock signals from a single clock source using complementary MOS (CMOS) circuitry is one of the most difficult design problems. This is because of the inability to control precisely certain variables in the fabrication process that affect pullup and pulldown delays in the fabricated chips. Channel length of a MOS field-effect transistor is an example of such variables. Since N-channel MOSFETs and P-channel MOSFETs use arsenic and boron diffusion to fabricate the drain-/source areas, respectively, and since their diffusion coefficients are different, the channel lengths of an NFET and a PFET vary independently of each other. These channel length variations generate uncertainties in pullup and pulldown delay times. Thus, two separate clock circuits are typically used in a PLA (programmable logic array)-like dynamic logic circuit; alternatively, static CMOS logic circuits are used, which require no clock signal, for slower speed applications. Thus, at the present time, no reliable technique has been developed of generating clock signals for cascaded, high speed dynamic CMOS logic circuits with only one clock input.

SUMMARY OF THE INVENTION

The invention is based on the realization that cascaded dynamic CMOS logic circuits requiring first and second clock pulses to first and second stages thereof, respectively, can be operated from a single source of clock pulses if a chain of an even number of CMOS inverters is included between the first clock input to the first stages and the second clock input to the second stages and if the inverters are designed according to a specified discipline with respect to the circuit elements of the dynamic stages. In such a case, the path through the dynamic gates in the first stage and the path of the inverters in the clock circuit can be treated as two logic paths which can be configured such that processing variations producing unpredictable delays in the separate paths will track one another. This is the teaching of my patent application Ser. No. 768,501, filed Aug. 22, 1985, and entitled HIGH SPEED CMOS CIRCUITS. Application of this teaching guarantees that uncontrollable delay variations between PFET and NFET elements in both dynamic logic gate and clock inverter paths compensate for each other and can be ignored by a designer. However, pulse transition delays of the first stage of the dynamic logic gate path are dominated by either pullup or pulldown delay (but not both), according to whether PFETs or NFETs are used as the active elements. Because the clock pulse inverter path is implemented with CMOS logic, in which both pullup and pulldown delays are significant, it is still possible to have race conditions between the second clock signals and the outputs of the first stage of the dynamic logic gate path.

To achieve the virtual elimination of the problem, the pulldown delay of the NFET elements, for example, in the first stage of the gate path is set by a worst case safety factor (considering still uncontrollable process variations and timing margin for complete pulldown of the node) to be less than the sum of the pulldown delays of the (NFET) elements in the inverter chain between the two clock inputs. In a preferred embodiment, one NFET in the inverter chain is designed in worst case to have a pulldown delay greater by the aforementioned safety factor than the NFET of the first dynamic logic gate. All remaining NFETs and PFETs in the inverter chain are designed to have very small pulldown delays. I have found that a safety factor set such that the pulldown delay of the inverter chain is 1.5 to 2 times the pulldown delay of the first dynamic logic stage, is satisfactory to eliminate all racing.

The elimination of uncertain, process dependent skew in multipath logic circuits by setting the sum of the pullup delays of a first path equal to the pullup delays of a second path and by setting the sum of the pulldown delays of the first path equal to the pulldown delays of the second path is disclosed in the above-mentioned copending patent application Ser. No. 768,501. The recognition that the pair of paths can be the dynamic gate path on the one hand and the clock delay circuit on the other, permits a choice of delays to eliminate uncertain, process dependent delay. The result not only permits widespread use of fast dynamic NOR circuits, for example, where they had been eliminated previously, but permits an increase in operating frequency by the use of such fast dynamic NOR circuits in key places on a chip, thereby creating the speed margin over competitive CMOS static circuits.

DETAILED DESCRIPTION

Figure 1:
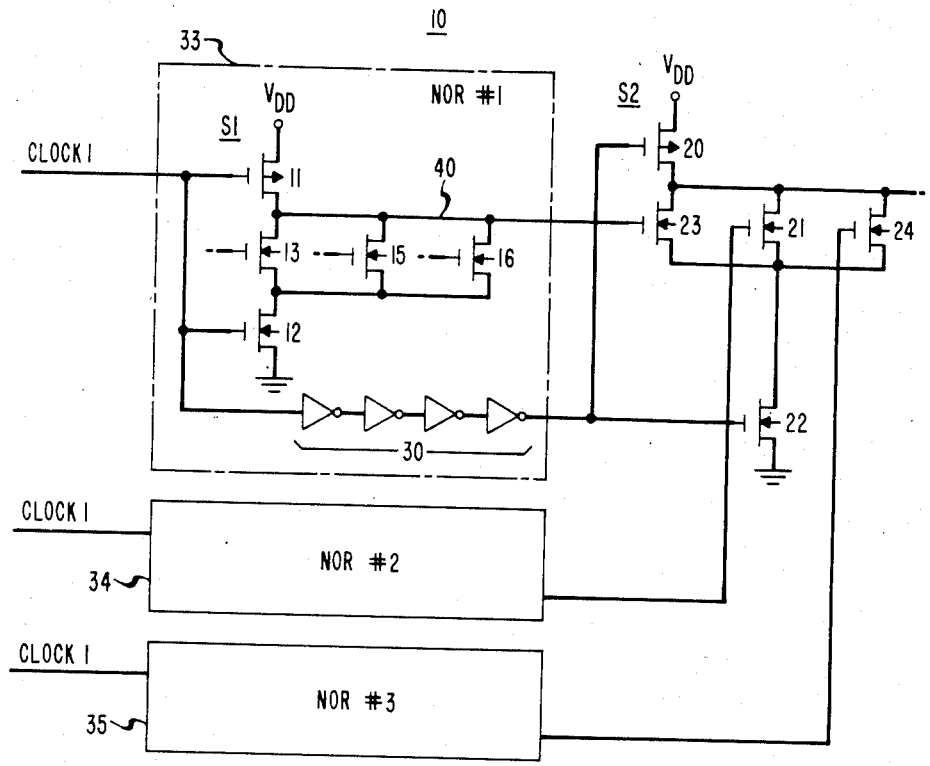
FIG. 1 is a circuit schematic of a multistage NOR circuit designed in accordance with this invention.

FIG. 1 shows a two stage dynamic logic circuit 10 including stages S1 and S2. Stage S1, comprises NFETs 12, 13, 15, 16 and PFET 11 as shown in FIG. 1. Each of NFETs 15 and 16 is connected electrically in parallel with the source and drain of NFET 13, thereby forming a three input dynamic NOR gate S1.

The second stage of the circuit comprises PFET 20 and NFETs 21, 22, 23 and 24, connected electrically as shown, between supply voltage $V_{DD}$ and ground to form a three input dynamic NOR gate S2. It is well known to those who are familiar with the art of CMOS logic circuit design, that such a cascaded NOR-NOR circuit can be combined with like circuits to generate any logic function desired.

The gate of NFET 12 is connected to a clock1 source (not shown). The gate of PFET 11 is connected to the gate of NFET 12, and via inverter chain 30, to the gates of PFET 20 and NFET 22. The gate of NFET 23 is connected to the drains of NFETs 13, 15 and 16. The gates of NFETs 21 and 24 are connected to outputs of similar S1 circuits represented by blocks 34 and 35.

Logic data are applied to the gates of NFETs 13, 15 and 16. The logic NOR output of those data appears at node 40 as clock1 makes a low to high transition, and is applied to the gate of NFET 23. Logic outputs from other NOR circuits represented by blocks 34 and 35 are applied to the gates of NFETs 21 and 24, respectively.

The timing of the arrival of a clock pulse at the gate of NFET 22 of the second dynamic stage depends on the inverter delays in inverter path 30. The inverters are chosen such that, ignoring uncontrollable process delay variations, the sum of the pulldown delays of the inverters of path 30 is larger than the pulldown delays of stage S1 (comprising NFETs 12, 13, 15 and 16 in the embodiment of FIG. 1) by the safety factor slightly in excess of one. The teaching of my aforementioned application, Ser. No. 768,501, is substantially met by maintaining only a small difference between the sum of the pulldown delays between the two paths. The reason for such a choice is to insure that the input race condition at the second dynamic logic stage S2 is avoided under any circuit parameter variation caused by processing, temperature, voltage, etc. Further, the choice allows the completion of logic operations in a minimum of time.

Figure 2:
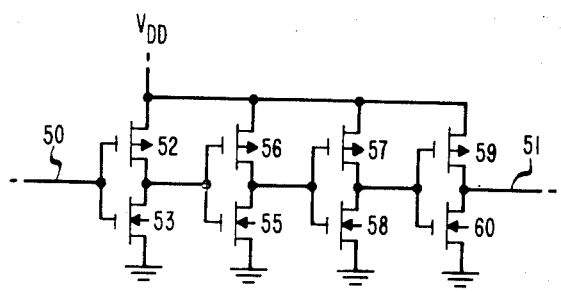
FIG. 2 is a circuit schematic of a portion of the circuit of FIG. 1 used to generate second stage clock signals.

FIG. 2 shows a circuit diagram of the inverter path in detail. The circuit comprises a four stage static CMOS arrangement with an input at 50 and an output at 51. The first stage comprises PFET 52 and NFET 53 connected between $V_{DD}$ and ground as shown. The successive stages include PFETs 56, 57 and 59 and NFETs 55, 58 and 60, as shown. For proper operation of the circuit, a clock pulse has to arrive at the gates of PFET 20 and NFET 22 of FIG. 1 after the pulldown of node 40 regardless of processing, temperature, and voltage excursions, and subject to the condition that the delay should be as small as possible.

Figure 3:
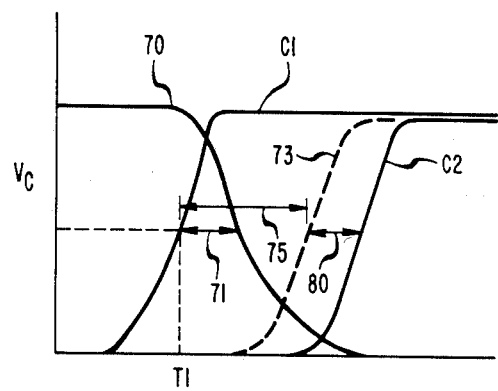
FIG. 3 is a pulse diagram of the circuit of FIG. 1.

The delay characterized by the sum of pulldown delays in the inverter clock path is discussed in connection with the pulse diagram of FIG. 3. Specifically, FIG. 3 is a pulse diagram depicting voltage clock pulse waveforms versus time. Clock pulse C1 applied to the gate of NFET 12 occurs at a time T1 as shown in FIG. 3. Node 40 is pulled down as shown by curve 70 provided at least one of the logic data applied to the gates of NFETs 13, 15, and 16 is high (turns on the NFET). The delay in the pulldown of node 40 is shown by double-headed arrow 71. The clock pulse applied to the gates of PFET 20 and NFET 22 is represented by curve C2 in FIG. 3. In the case where the pullup delays of the PFETs in the inverter path 30 (PFETs 56 and 59) are negligible, the clock at NFET 22 and PFET 20 is the sum of the pulldown delays of NFETs (53 and 58 of FIG. 2) and is shown by dotted curve 73. The delay between C1 and 73 in this near ideal case is shown as double-headed arrow 75. Realistically, pullup delays by PFETs 56 and 59 exist, and the delay of the pullup results in the actual clock pulse at NFET 22 and PFET 20 as shown by curve C2, with an additional delay as indicated by double-headed arrow 80. Delay 80 is preferably made as small as possible to improve operating speed. This is accomplished by making the physical channel widths of PFETs 56 and 59 in FIG. 2 large with respect to the channel widths of their respective companion NFETs 55 and 60.

Delay 80 is a function of process, temperature and voltage. No logic operation occurs during pulldown of clock1 in FIG. 1 when PFET 11 (FIG. 1) is operated to precharge node 40, and the clock pulldown delay to FETs 20 and 22 do not matter. In practice then, delay 80 (double-headed arrow 80) can be made a small fraction of delay 75, typically less than ½ thereof, in the interest of logic speed.

It is important to recognize that the logic path of stage S1 is a dynamic CMOS path, whereas the clock path 30 is composed of static cascaded CMOS stages. Therefore, the pulldown delay of the dynamic path is predominantly controlled by NFETs 12, 13, 15 and 16. The delay of the clock path 30, however, comprises the sum of significant PFET and NFET delays. In accordance with the teaching of my aforementioned application, Ser. No. 768,501 the delay of the logic path of stage S1 caused by NFET elements tracks the portion of the clock path delay caused by the NFET elements of the clock path. However, the clock path delay caused by PFET elements has no counterpart in the logic path. Thus, for a race-free operation of the cascaded dynamic stages S1 and S2, the part of the delay of the clock delay path 30 contributed by NFET elements 53 and 58 must be longer than the pulldown delay at gate S1 by the safety factor. Further, for high performance operation of the cascaded logic, the part of the delay of the clock delay path 30 contributed by PFETs should be made as short as possible. For a preferred mode of operation, the delay D (double-headed arrow 75) of an ideal clock circuit with an inverter path as shown in FIGS. 1 and 2 is expressed as follows:

$D = (1.5 \text{ to } 2) \times$ Delay 71 (delay of pulldown by FET 12 and one of 13, 15, 16); delay 80 should approach zero. This is accomplished by making the channel widths of PFETs 56 and 59 of FIG. 2 quite large (typically, larger than the sum of widths of the FETs 20 and 22 of FIG. 1), making the channel widths of NFETs 55 and 60 of FIG. 2 to be quite small (typically less than 1/5 of the size of PFET 56 and 59), and then by sizing NFET 53 and 58 to attain the required delay given by the formula shown above. The channel widths of PFETs 52 and 57 are chosen to be about the same as NFETs 53 and 58. A cascaded dynamic logic circuit made within the above constraints will be essentially free of race conditions introduced by processing, temperature and voltage uncertainties. The factor of 1.5 to 2 in the equation easily ensures proper operation and maintains desirability of fast operation.

The proper choice of the clock delays in accordance with this invention leads to fast cascaded dynamic NOR gates capable of switching considerably faster than prior art static NOR circuits. Although the invention is disclosed in terms of NFET dominated NOR logic gate technology, the skilled art worker will recognize that the invention may have application in other than NOR gate technology and also that complementary dual circuits dominated by PFETs may be designed in accordance with the teaching herein.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A dynamic complementary MOS (CMOS) logic circuit comprising first and second cascaded logic stages having, respectively, a first plurality and a second plurality of logic input terminals, a first and a second clock input terminal, and a first and a second output terminal.

said first stage having a logic array of field effect transistors of one channel conductivity type (N or P), said array being connected between the first logic input terminals and the first output terminal, said first output terminal being connected to one of the second plurality of logic input terminals, means for applying a sequence of clock pulses to said first clock input terminal.

delay means, having an even number of cascade-connected CMOS inverter stages, responsive to the sequence of clock pulses for developing and applying delayed clock pulses to said second clock input terminal, the first output terminal being precharged during the absence of a clock pulse, the first stage having a characteristic delay of a first type (pullup or pulldown) with respect to an initial edge of a clock pulse and to logic signals applied to its first input terminals, and the delay means being arranged such that the sum of the delays of said first type of all odd numbered inverter stages numbered from the first clock input is greater than, but less than two times, the first type delay of the first logic stage, and the sum of the delays of a second type (pulldown or pullup) of all even numbered inverter stages is small compared to the sum of the first type delays of the odd inverter stages.

2. A logic circuit in accordance with claim 1 in which the sum of the first type delays of all odd inverter stages is within a range of 1.5 to 2 times the first type delay of the first logic stage.

3. A logic circuit in accordance with claim 1 or claim 2 in which each inverter stage of the delay means comprises an N-type field effect transistor and a P-type field effect transistor, each with a channel width perpendicular to the direction of current conduction through the transistor, and wherein the channel width of one transistor of one of the inverter stages is designed to contribute substantially all of the first type delay of the delay means.

4. The invention of claim 3 in which the one transistor is an N-type transistor of an odd-numbered inverter stage.

5. A logic circuit in accordance with claim 4 in which the channel widths of the N-type transistors of the remaining odd-numbered stages of the delay means are large compared to the channel width of said one of the odd-numbered inverter stages.

6. A logic circuit in accordance with claim 4 in which the channel width of the P-type transistor in each of the odd-numbered inverter stages is approximately equal to the channel width of the N-type transistor of that inverter stage.

7. A logic circuit in accordance with claim 3 in which the channel width of the P-type transistor in each even-numbered inverter stage is large compared to the channel width of the N-type transistor in that inverter stage.

8. A complementary MOS (CMOS) integrated circuit chip comprising first and second signal path circuits having a common input and separate outputs, the signal path of the first circuit comprising a network of dynamic CMOS transistors having a logic array of one prescribed channel-conductivity type (N or P), with the network supplying an output signal to the output of the first circuit in response to an input signal at the common input, means for precharging the network before receipt of the input signal so that the network contributes a characteristic delay of only one type (pullup or pulldown) to an output signal generated at the first circuit output in response to the signal at the common input, the signal path of the second circuit comprising a plurality of CMOS transistors contributing both an overall characteristic pullup and pulldown delay to a signal generated at the second output terminal in response to the input signal, the first and second circuits being fabricated such that, in the second circuit, the characteristic delay of the same type as present in the network is greater than, but less than twice, the characteristic delay of the network and the characteristic delay of the remaining type is substantially equal to zero, whereby the second circuit output signal always lags the first circuit output signal with reduced unpredictable skew.

* * * * *